(12) United States Patent
Canney et al.

(10) Patent No.: US 9,179,574 B2
(45) Date of Patent: Nov. 3, 2015

(54) COOLING UNIT FOR CONTAINER-TYPE DATA CENTER

(75) Inventors: Brian A. Canney, Jackson, NJ (US); David P. Graybill, Staatsburg, NY (US); Madhusudan K. Iyengar, Woodstock, NY (US); Vinod Kamath, Raleigh, NC (US); Roger R. Schmidt, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1077 days.

(21) Appl. No.: 13/114,203

(22) Filed: May 24, 2011

(65) Prior Publication Data

US 2012/0297807 A1 Nov. 29, 2012

(51) Int. Cl.
*H05K 7/14* (2006.01)
*H05K 7/20* (2006.01)
*F25B 25/00* (2006.01)
(Continued)

(52) U.S. Cl.
CPC ............ *H05K 7/1497* (2013.01); *F25B 25/005* (2013.01); *H05K 7/2079* (2013.01); *F25B 2700/2106* (2013.01); *F25B 2700/21173* (2013.01); *F25D 11/003* (2013.01); *F25D 17/02* (2013.01); *Y10T 29/49359* (2015.01)

(58) Field of Classification Search
CPC ..... F25D 17/02; F25D 31/002; F25D 31/006; F25D 11/003; F25B 2600/13; F25B 2600/02; F25B 31/006; F25B 2600/025; F25B 49/025; F25B 25/005; F25B 2700/2106; F25B 2700/21173; H05K 7/1497; H05K 7/2079; Y10T 29/49359

USPC .................. 62/185, 201, 259.2, 228.1, 228.4; 361/699, 701
See application file for complete search history.

(56) References Cited

U.S. PATENT DOCUMENTS 5,291,941 A * 3/1994 Enomoto et al. ................ 165/62
5,482,113 A 1/1996 Agonafer et al.
(Continued)

OTHER PUBLICATIONS

Mahaney et al., "Container-Based Data Center Having Greater Rack Density", U.S. Appl. No. 12/647,783, filed Dec. 28, 2009.
(Continued)

*Primary Examiner* — Allana Lewin Bidder
*Assistant Examiner* — Kun Kai Ma
(74) *Attorney, Agent, or Firm* — Margaret A. McNamara, Esq.; Kevin P. Radigan, Esq.; Heslin Rothenberg Farley & Mesiti P.C.

(57) ABSTRACT

A cooling unit and cooling method are provided for a container-type data center. The cooling unit includes a heat rejection unit, for rejecting heat from coolant passing through a coolant loop to air passing across the heat rejection unit, and a refrigeration unit controllable to selectively provide auxiliary cooling to at least a portion of the coolant passing through the coolant loop. The heat rejection unit includes a heat exchange assembly, having a first heat exchanger and a second heat exchanger, and one or more air-moving devices providing airflow across the first and second heat exchangers. The first heat exchanger couples in fluid communication with the coolant loop, and the second heat exchanger is coupled in fluid communication with a refrigeration loop of the refrigeration unit for rejecting heat from refrigerant passing through the refrigeration loop to the airflow passing across the second heat exchanger.

18 Claims, 10 Drawing Sheets

(51) Int. Cl.
*F25D 11/00* (2006.01)
*F25D 17/02* (2006.01)

(56) References Cited

U.S. PATENT DOCUMENTS

| | | |
|---|---|---|
| 5,970,729 A | 10/1999 | Yamamoto et al. |
| 6,205,803 B1 * | 3/2001 | Scaringe ............... 62/259.2 |
| 6,313,990 B1 | 11/2001 | Cheon |
| 6,705,089 B2 | 3/2004 | Chu et al. |
| 7,011,143 B2 | 3/2006 | Corrado et al. |
| 7,024,573 B2 | 4/2006 | Patel et al. |
| 7,469,551 B2 | 12/2008 | Tilton et al. |
| 7,551,440 B2 | 6/2009 | Belady et al. |
| 7,855,890 B2 * | 12/2010 | Kashirajima et al. ......... 361/700 |
| 2007/0119569 A1 | 5/2007 | Campbell et al. |
| 2008/0062647 A1 * | 3/2008 | Hillis et al. ................. 361/699 |
| 2009/0086428 A1 | 4/2009 | Campbell et al. |
| 2009/0260384 A1 | 10/2009 | Champion et al. |
| 2010/0091448 A1 * | 4/2010 | Noteboom et al. ...... 361/679.48 |
| 2010/0281901 A1 * | 11/2010 | Kawase et al. ............... 62/238.7 |
| 2011/0051372 A1 | 3/2011 | Barringer et al. |
| 2011/0096503 A1 * | 4/2011 | Avery et al. ................... 361/701 |

OTHER PUBLICATIONS

Campbell et al., "Vapor-Compression Refrigeration Apparatus With Refrigerant Bypass and Controlled Heat Load", U.S. Appl. No. 12/939,552, filed Nov. 4, 2010.

* cited by examiner

COOLING UNIT FOR CONTAINER-TYPE DATA CENTER

BACKGROUND

A container-type data center is a data center implemented within, for example, a shipping-type container, which conventionally refers to a container that can be placed, for example, on the trailer of a truck, the cargo car of a train, or on a ship. A container-type data center includes at least some of the equipment needed to implement a data center. In one embodiment, the data center is implemented in a single shipping container, while in another embodiment, the data center may be implemented in multiple shipping containers. Advantageously, a container-type data center can be assembled at one location, and then readily transported to a different location, where the data center is to be used.

After the container-type data center reaches its destination, external power and data communication lines are connected and the data center is ready for use, since substantially all the equipment of the data center has already been installed within the shipping container. For this reason, container-type data centers are becoming more popular. They provide an easy and fast way in which to add additional computing capacity to any installation.

BRIEF SUMMARY

Disclosed herein are various cooling units and methods for cooling a data center, such as a container-type data center. In one aspect, a cooling unit is provided which includes a heat rejection unit and a refrigeration unit. The heat rejection unit, which couples to a coolant loop for rejecting heat from coolant passing through the coolant loop to air passing across the heat rejection unit, includes a heat exchange assembly, comprising a first heat exchanger and a second heat exchanger, and at least one air-moving device for providing airflow across the first heat exchanger and the second heat exchanger. The refrigeration unit is controllable to selectively provide auxiliary cooling to at least a portion of the coolant passing through the coolant loop. The first heat exchanger of the heat exchange assembly couples in fluid communication with the coolant loop, and the second heat exchanger of the heat exchange assembly is coupled in fluid communication with a refrigerant loop of the refrigeration unit for rejecting heat from refrigerant passing through the refrigeration loop to the airflow passing across the second heat exchanger.

In another aspect, a data center is provided which includes: a plurality of electronics racks; a container housing the plurality of electronics racks; a coolant loop facilitating extraction of heat generated within one or more of the electronics rack; and a cooling unit. The cooling unit includes a heat rejection unit and a refrigeration unit. The heat rejection unit is coupled in fluid communication with the coolant loop for rejecting heat from coolant passing through the coolant loop to air passing through the heat rejection unit. The heat rejection unit includes a heat exchange assembly, comprising a first heat exchanger and a second heat exchanger, and at least one air-moving device for providing airflow across the first heat exchanger and the second heat exchanger. The refrigeration unit is controllable to selectively provide auxiliary cooling to at least a portion of the coolant passing through the coolant loop. The first heat exchanger of the heat exchange assembly is coupled in fluid communication with the coolant loop, and the second heat exchanger of the heat exchange assembly is coupled in fluid communication with a refrigeration loop of the refrigeration unit for rejecting heat passing through the refrigeration loop to the airflow passing across the second heat exchanger.

In a further aspect, a method of fabricating a cooling unit for a data center is provided. The method includes: providing a heat rejection unit for rejecting heat from coolant passing through a coolant loop to air passing across the heat rejection unit, the heat rejection unit including a heat exchange assembly comprising a first heat exchanger and a second heat exchanger, and at least one air-moving device for providing airflow across the first heat exchanger and the second heat exchanger; providing a refrigeration unit, the refrigeration unit being controllable to selectively provide auxiliary cooling to at least a portion of the coolant passing through the coolant loop, wherein the first heat exchanger of the heat exchange assembly couples in fluid communication with the coolant loop, and the second heat exchanger of the heat exchange assembly is coupled in fluid communication with a refrigeration loop of the refrigeration unit for rejecting heat from the refrigerant passing through the refrigeration loop to the airflow passing across the second heat exchanger; and providing a controller for operating the cooling unit in one of a first mode, wherein the refrigeration unit is OFF and heat is rejected, via the first heat exchanger, from coolant passing through the coolant loop to the airflow passing across the first heat exchanger, or a second mode, wherein the refrigeration unit is ON and heat is rejected, via the first heat exchanger and the second heat exchanger, to the airflow passing across the first heat exchanger and the second heat exchanger.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
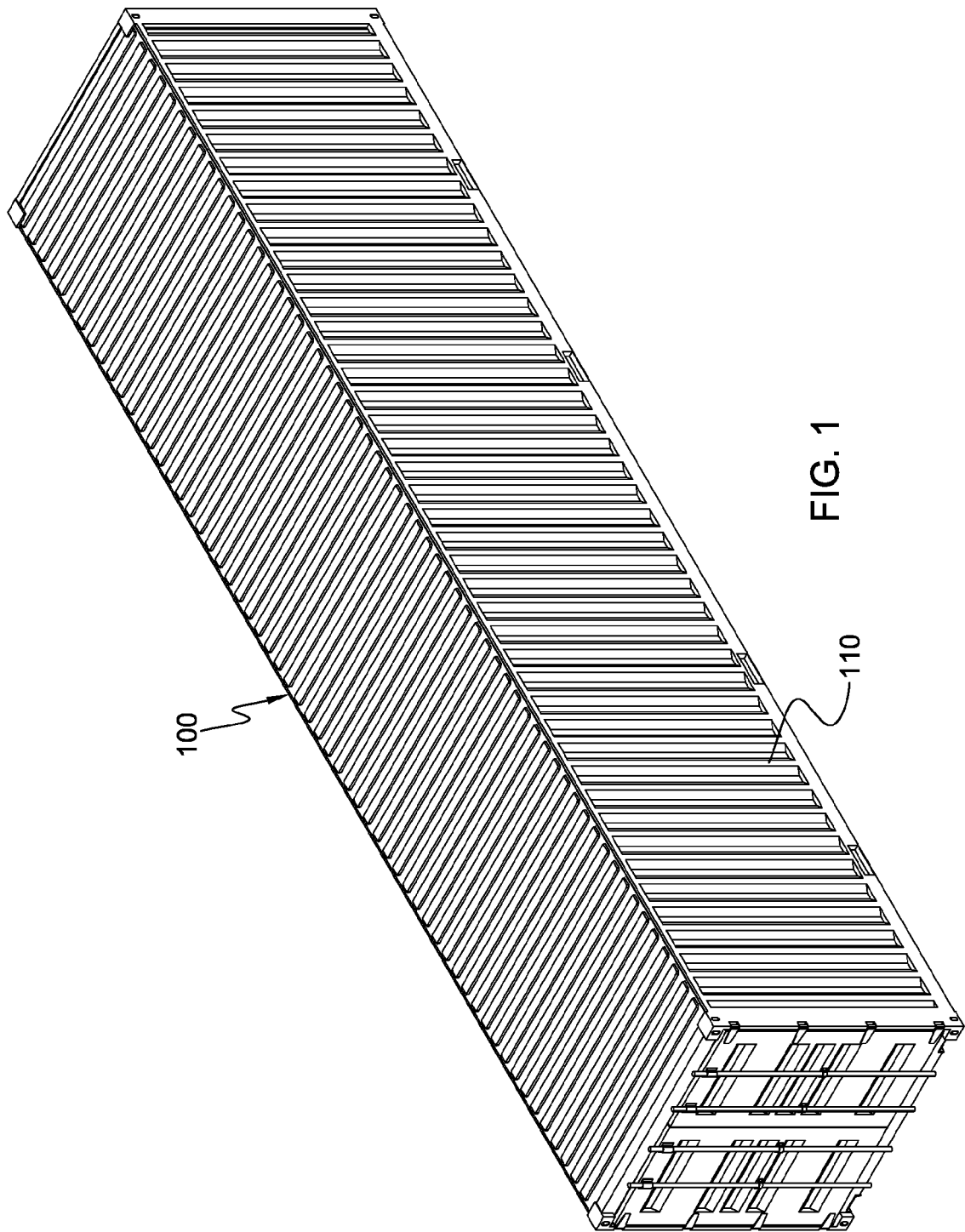
FIG. 1 depicts one embodiment of a container-type data center to employ a cooling unit, in accordance with one or more aspects of the present invention.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with the rack-mounted electronic drawers of a multi-drawer rack unit and blades of a blade center system being two examples of systems (or subsystems) of an electronics rack to be cooled.

"Electronic component" refers to any heat generating electronic component of, for example, a computer system or other electronic system requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

Unless otherwise specified herein, the terms "liquid-cooled structure" and "liquid-cooled cold plate" refer to thermally conductive structures having one or more channels (or passageways) formed therein or passing therethrough, which facilitate flow of coolant therethrough. In one example, tubing is provided extending through the liquid-cooled structure (or liquid-cooled cold plate).

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubings (such as copper or other tubing) in thermal or mechanical contact with a plurality of air-cooled cooling fins. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubings (such as copper or other tubing) in thermal or mechanical communication with each other. Size, configuration and construction of the liquid-to-liquid heat exchanger can vary without departing from the scope of the invention disclosed herein. Further, as used herein "data center" refers to a computer installation containing, for example, one or more electronics racks to be cooled. As a specific example, a data center may include one or more electronic systems or computing units, such as server units, housed within a container, such as a shipping container.

One example of the coolant employed herein is water. However, the concepts disclosed herein are readily adapted to use with other types of coolant on the cooling unit side and/or on the system side. For example, one or more of the coolants may comprise a brine, a dielectric liquid, a fluorocarbon liquid, a liquid metal, or other similar coolant, or refrigerant, while still maintaining the advantages and unique features of the present invention. One example of refrigerant employed in the embodiments described below is R134-a refrigerant. Other examples may include R245fa, R404, R12, or R22 refrigerant.

Reference is made below to the drawings (which are not drawn to scale to facilitate understanding of the invention), wherein the same reference numbers used throughout different figures designate the same or similar components.

As noted, container-type data centers are becoming more prevalent in the IT industry, especially in the cloud computing market. Energy efficiency and total cost of ownership are important considerations in this market. In view of this, disclosed herein are various cooling units for (and methods of cooling) a container-based data center, which are highly energy efficient and embody very low-cost cooling designs.

FIG. 1 illustrates, by way of example, one embodiment of a container-type data center 100 comprising a container 110 with, in one embodiment, a plurality of electronics racks disposed therein requiring cooling. A typical container 110 might be roughly 10, 20, 40, or 53 feet in length, and have a width of approximately eight feet. A container having these dimensions corresponds to a standard shipping container that can be placed, for example, on a trailer (for delivery by a truck), or could be placed on a cargo car (for delivery by a train). A container-type data center may comprise a single container housing the electronics racks and associated infrastructure components, or multiple containers comprising the rack units and infrastructure. In one embodiment, the electronics racks might reside in one container of a multi-container data center, and one or more infrastructure components (such as input/output and power components, as well as cooling components), might reside in a separate container. The cooling units and cooling methods disclosed herein are applicable to any data center solution, including single-type container or multiple container-type data center solutions.

Figure 2:
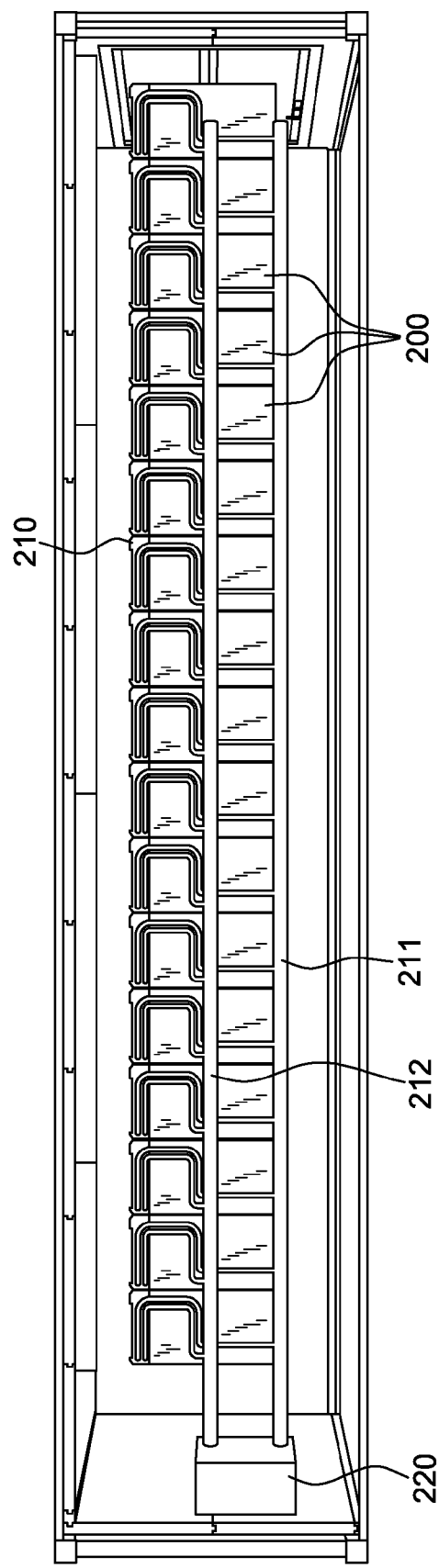
FIG. 2 is a plan view of one embodiment of a container-type data center to employ a cooling unit, in accordance with one or more aspects of the present invention.

By way of example, FIG. 2 is a plan view of one container-type data center layout comprising a row of electronics racks 200, each with an air-to-liquid heat exchanger 210 disposed at the back thereof, for example, as part of an outlet door. In this embodiment, overhead supply and return headers 211, 212 are provided, which comprise part of a system coolant loop that circulates system coolant between a coolant distribution unit 220 and the air-to-liquid heat exchangers 210 (via respective coolant and supply return hoses). In one embodiment, heat is rejected from the system coolant loop, comprising system coolant supply and return headers 211, 212, to a facility coolant loop (not shown) comprising, for example, facility coolant such as refrigeration-chilled facility coolant.

Note that the container-type data center layout of FIG. 2, and the liquid-cooling approach described hereinbelow with reference to FIGS. 3-7, are provided by way of example only. The cooling unit and cooling approach disclosed herein with reference to FIGS. 8-10 could be employed with many different data center configurations and liquid-cooling approaches. For example, rather than cooling coolant for a coolant distribution unit (of, for example, an air-to-liquid heat exchangers embodiment), the coolant units disclosed herein could feed liquid coolant to one or more air-conditioning units which are cooling air within the container housing the components to be cooled. Another alternative is to provide liquid-cooled structures disposed within one or more of the electronics racks in close proximity to electronic component(s) to be cooled, such that conduction of heat from the electronic component(s) to the liquid-cooled structure(s) allows for rejection of heat to the coolant for ultimate transfer to the cooling unit(s) disclosed herein. The cooling unit(s) disclosed herein may be employed with any liquid-cooling approach for extracting heat from a data center, such as a container-type data center or, more particularly, for extracting heat from one or more electronics racks or electronic components within the data center.

Figure 3:
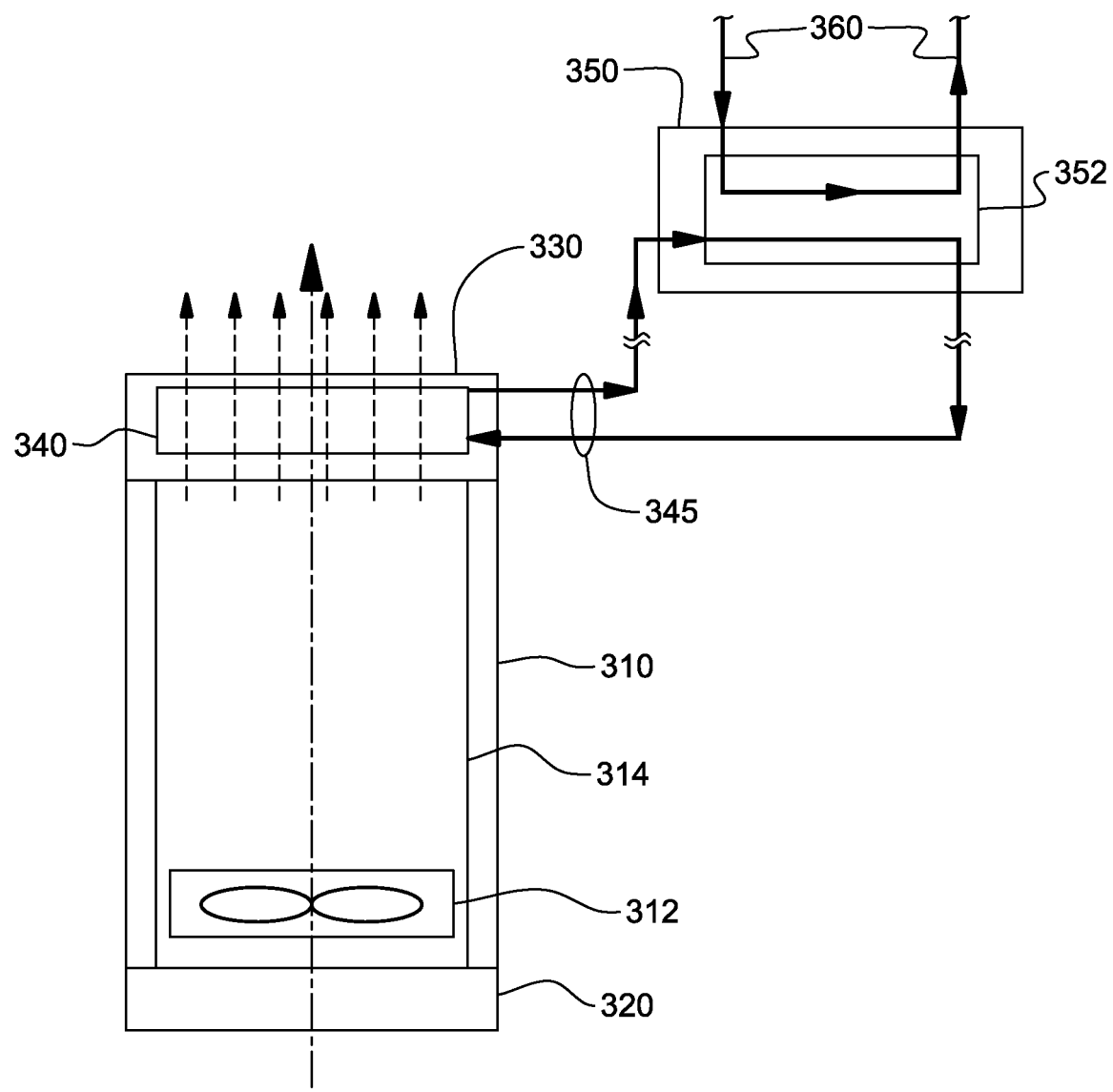
FIG. 3 is a top plan view of one embodiment of an electronics rack to reside within a container-type data center, and showing an air-to-liquid heat exchanger mounted to an outlet door thereof, with extracted heat being transferred through a coolant distribution unit, in accordance with one or more aspects of the present invention.

FIG. 3 depicts one embodiment of an electronics rack 310 having an inlet door 320 and an outlet door 330, which respectively have openings to allow for the ingress and egress of external air through the air inlet side and air outlet side of electronics rack 310. The electronics rack further includes at least one air-moving device 312 for moving external air across at least one electronic system 314 positioned within the electronics rack. Disposed within outlet door 330 is an air-to-liquid heat exchanger 340 across which the inlet-to-outlet airflow through the electronics rack passes. A remote coolant distribution unit 350 is used to buffer the system coolant in the air-to-liquid heat exchanger from, for example, facility coolant in a facility coolant loop 360. Air-to-liquid heat exchanger 340 extracts heat from the exhausted inlet-to-outlet airflow through the electronics rack to the system coolant, for ultimate transfer via coolant distribution unit 350 to the facility coolant via a liquid-to-liquid heat exchanger 352 disposed within the coolant distribution unit. As shown in FIG. 3, a system coolant loop 345 couples air-to-liquid heat exchanger 340 to coolant distribution unit 350. In one embodiment, the system coolant employed is water. This cooling apparatus advantageously reduces heat load on any computer room air-conditioning (CRAC) units within the data center, and facilitates cooling of the electronics racks by cooling the air egressing from the electronics racks and thus cooling any air recirculating to the air inlet sides thereof.

As illustrated in FIG. 2, in one embodiment, the system coolant supply and return headers are mounted overhead relative to the electronics rack(s) within the container of the container-type data center. In such a layout, the coolant distribution unit may also be mounted overhead within the container.

Figure 4:
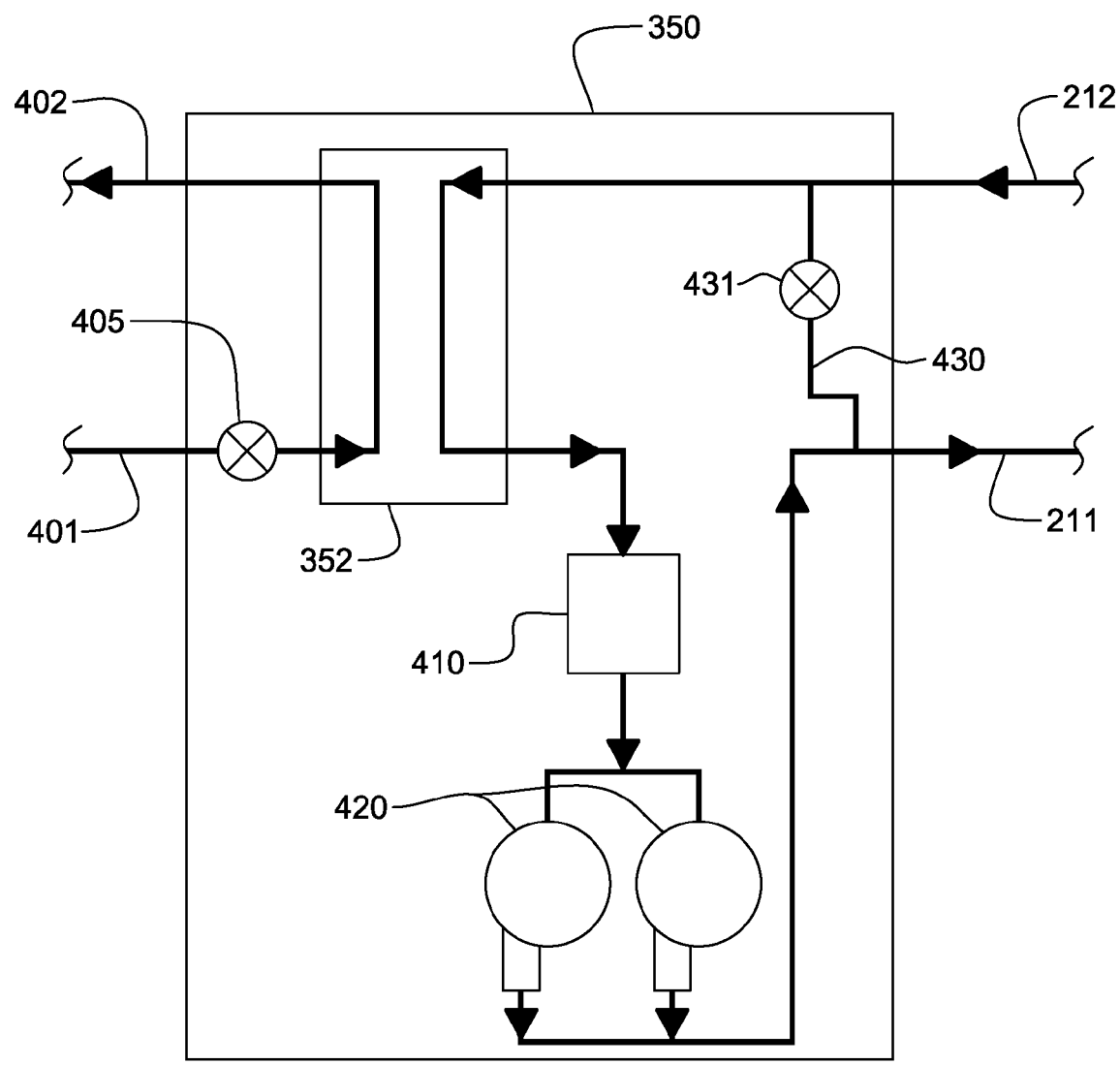
FIG. 4 is a schematic of one embodiment of a coolant distribution unit to be used in association with cooling a container-type data center such as depicted in FIGS. 1-2, in accordance with one or more aspects of the present invention.

FIG. 4 depicts one embodiment of a coolant distribution unit 350 for a container-type data center 100, such as depicted in FIGS. 1 & 2. Coolant distribution unit 350 again includes a liquid-to-liquid heat exchanger 352, which facilitates cooling of the system coolant within the system coolant loop comprising system coolant supply and return headers 211, 212. In one embodiment, the system coolant, upon return to the coolant distribution unit, has undergone heating, and possibly vaporization, within the respective air-to-liquid heat exchangers disposed within, for example, the outlet doors of the electronics racks within the container housing the data center. The facility coolant loop of liquid-to-liquid heat exchanger 352 comprises facility coolant supply line 401 and facility coolant return line 402, which in one embodiment provide cooled, cooling unit (not shown) water to the liquid-to-liquid heat exchanger of the coolant distribution unit associated with the container. Note that the use of the phrase "facility coolant" in this example refers to coolant on, for example, the cooling unit side of the liquid-to-liquid heat exchanger 352 of the coolant distribution unit. In an alternate configuration, there is no facility coolant, and the system coolant loop couples directly between, for example, one or more heat exchangers or heat sinks disposed within the data center, and a cooling unit, such as described hereinbelow.

A control valve 405 may be employed in facility coolant supply line 401 to control coolant flow rate through the liquid-to-liquid heat exchanger 352. After the system coolant is cooled within the liquid-to-liquid heat exchanger 352, the cooled system coolant is collected in a reservoir 410 for pumping via, for example, a redundant pump assembly 420, back to the respective electronics racks via the system coolant supply header 211. A bypass line 430 with a bypass valve 431 may be employed to control the amount of system coolant fed back through the system coolant supply header, and hence, control temperature of system coolant delivered to the respective heat extraction structures associated with the electronics racks.

Figure 5:
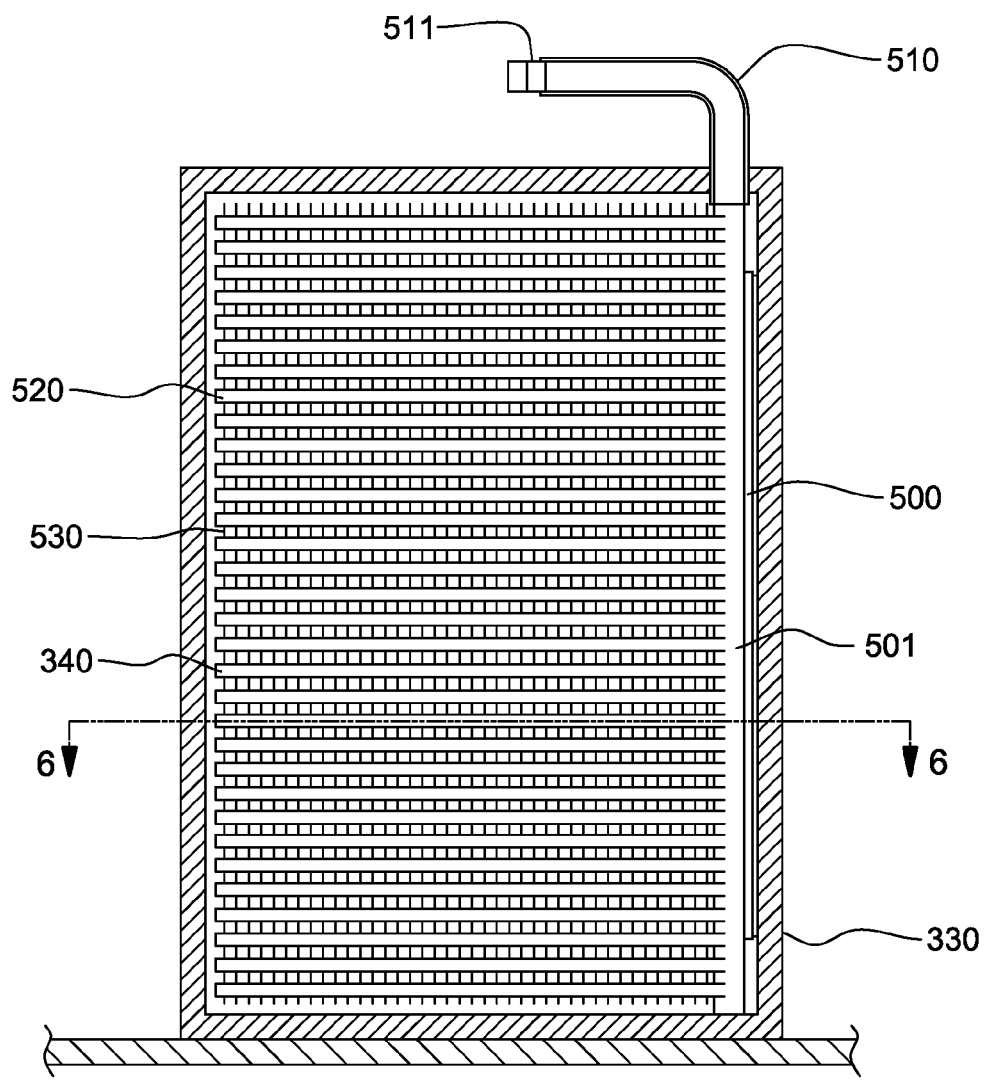
FIG. 5 is a partial cross-sectional elevational view of one embodiment of an electronics rack door with an air-to-liquid heat exchanger mounted thereto, taken along line 5-5 in FIG. 6, in accordance with one or more aspects of the present invention.
Figure 6:
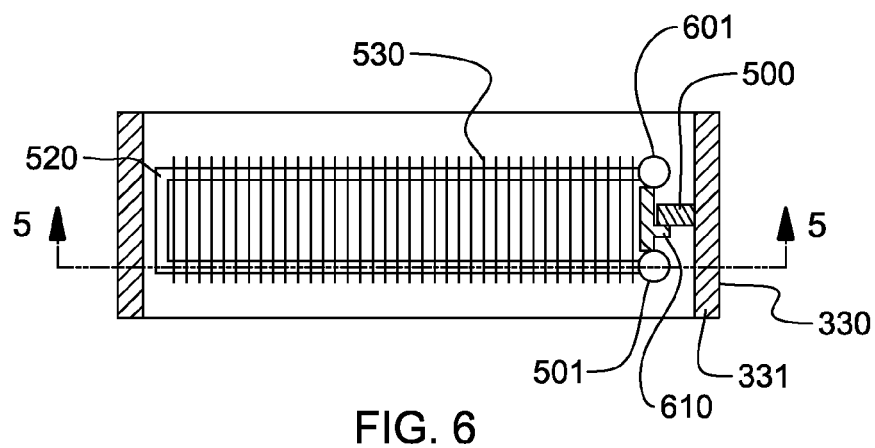
FIG. 6 is a cross-sectional, top plan view of the door and air-to-liquid heat exchanger of FIG. 5, taken along line 6-6 in FIG. 5, in accordance with one or more aspects of the present invention.

FIGS. 5 & 6 depict one embodiment of an outlet door 330 supporting an air-to-liquid heat exchanger 340, with system coolant inlet and outlet plenums 501, 601. Referring to both figures collectively, outlet door frame 331 supports a rigid flap 500, which attaches, for example, by brazing or soldering, to a plate 610 secured between the system coolant inlet plenum 501 and system coolant outlet plenum 601.

In FIG. 5, right angle bend 510 is shown disposed at the top of system coolant inlet plenum 501. This right angle bend defines a horizontal inlet plenum portion, which extends above the top of door 330. The coolant inlet to system coolant inlet plenum 501 is coupled to a connect coupling 511 for facilitating connection thereof to the respective supply hose, as described above. The air-to-liquid heat exchanger comprises a plurality of horizontally-oriented heat exchange tube sections 520. These heat exchange tube sections 520 each comprise a coolant channel having an inlet and an outlet, with each coolant channel being coupled to the system coolant inlet plenum 501 and each coolant channel outlet being coupled to the system coolant outlet plenum 601. A plurality of fins 530 are attached to horizontally-oriented heat exchange tube sections 520 for facilitating transfer of heat from air passing across the air-to-liquid heat exchanger to coolant flowing through the plurality of heat exchange tube sections 520. In one embodiment, the plurality of fins are vertically-oriented, rectangular fins attached to horizontally-oriented heat exchange tube sections 520.

Figure 7:
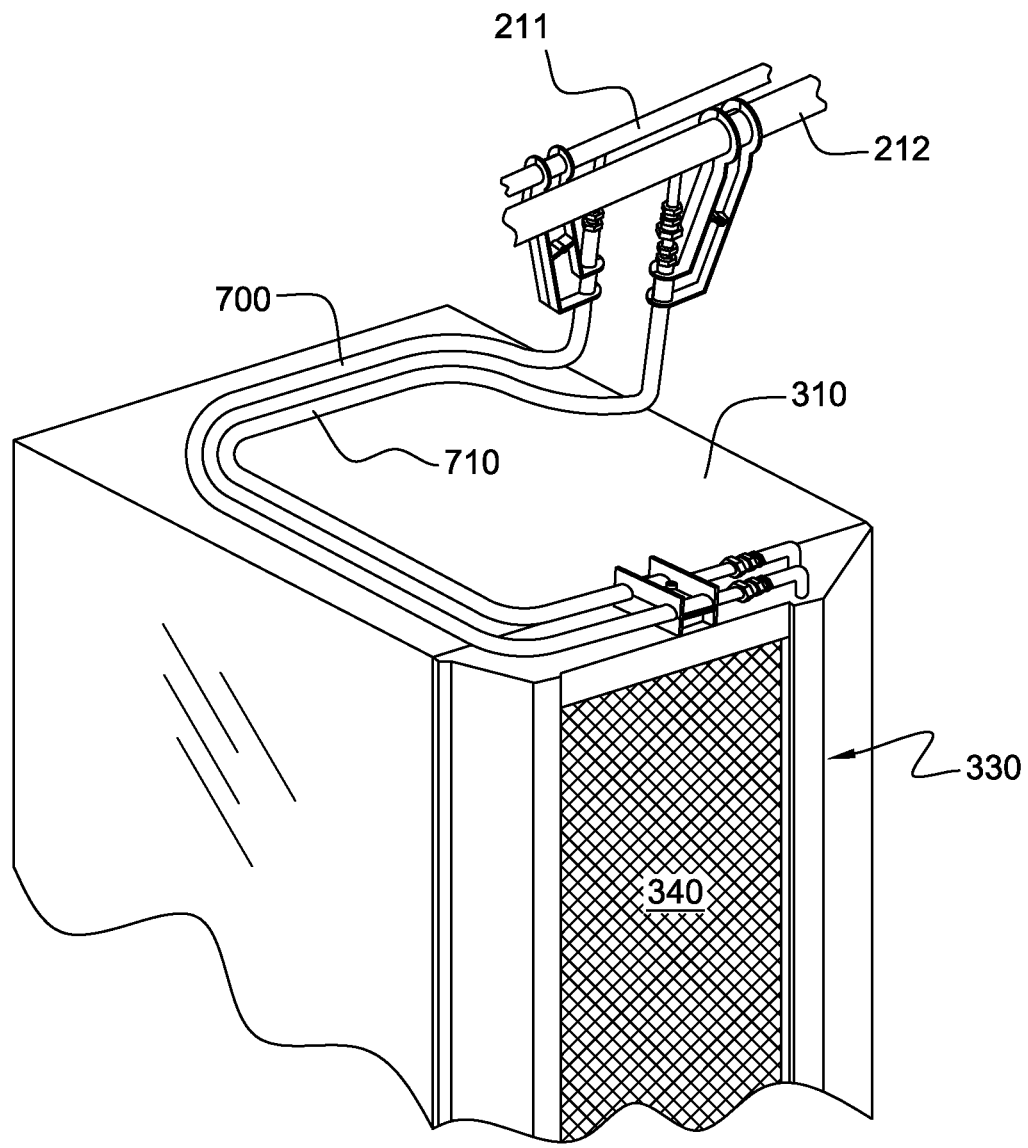
FIG. 7 is a partial isometric view of one embodiment of an electronics rack, with an electronics rack door having an air-to-liquid heat exchanger, and illustrating coolant supply and return headers disposed (for example) within a container-type data center, in accordance with one or more aspects of the present invention.

FIG. 7 depicts one embodiment of electronics rack 310 comprising a hinged outlet door 330 with an air-to-liquid heat exchanger 340 disposed therein, and illustrating overhead system coolant supply and return headers 211, 212, respectively. As shown, system coolant supply and return hoses 700, 710 couple the air-to-liquid heat exchanger 340 in fluid communication with the system coolant supply and return headers 211, 212, respectively. In one embodiment, system coolant supply and return hoses 700, 710 are sufficiently sized to allow for translational and rotational movement of the hoses with opening or closing of the heat exchanger door. If desired, retention loops could be provided for constraining movement of the hoses at multiple locations on top of the electronics rack.

As noted above, the liquid-cooling approach to extracting heat from a container-type data center described herein with reference to FIGS. 2-7 is presented by way of example only. The cooling units and cooling approaches described below can reject heat in association with any type of liquid-cooling approach employed in extracting heat from the data center. For example, the liquid-cooling approach employed within the data center could be implemented without use of a coolant distribution unit, in which case the liquid coolant flowing within the data center might be the same coolant as that fed through the cooling unit. Other air-conditioning-based implementations and conduction-based implementations (i.e., employing various liquid-cooled conduction structures) using a circulating liquid coolant for extracting heat from the data center will be apparent to those skilled in the art, all of which may be employed in association with a cooling unit such as disclosed herein.

Figure 8:
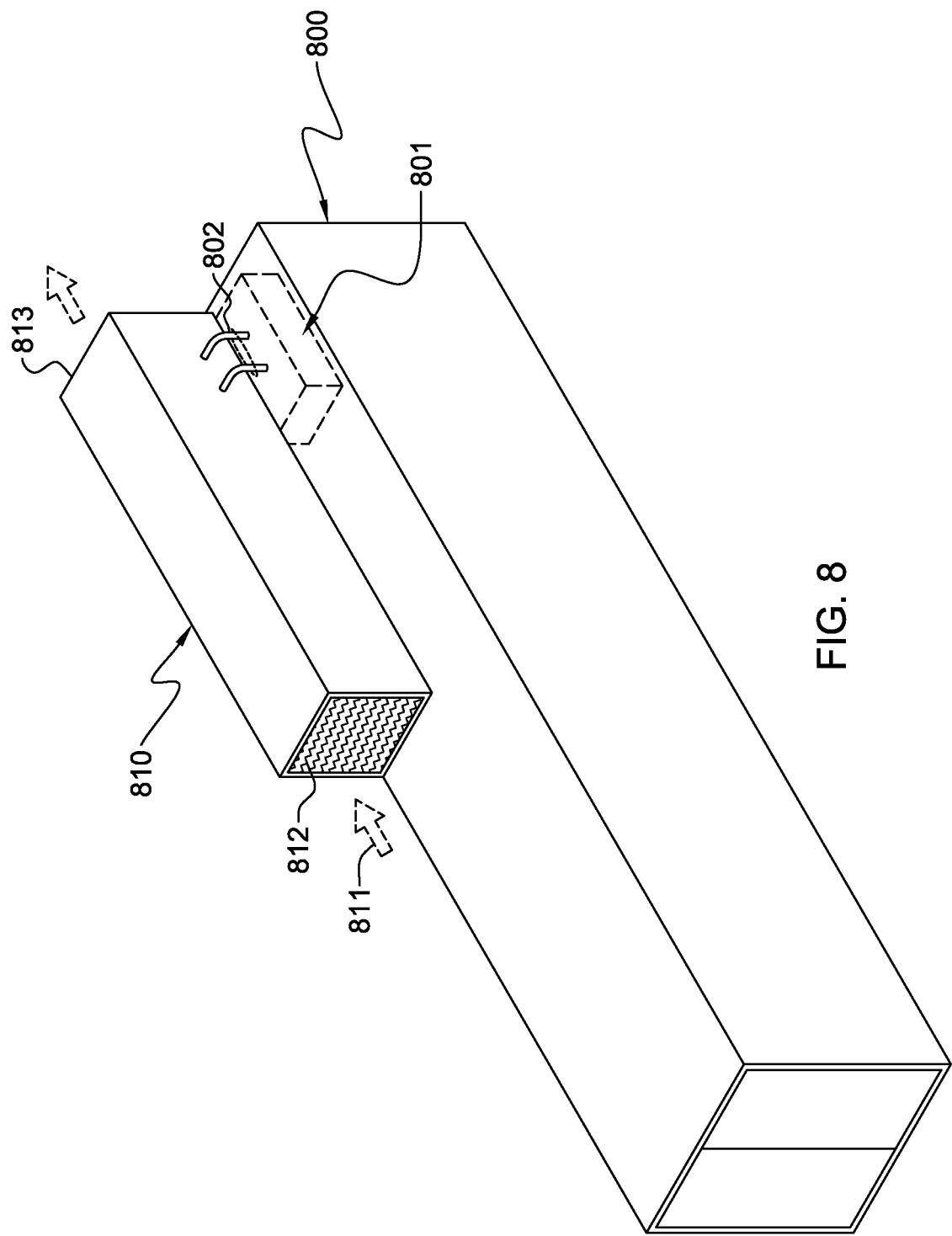
FIG. 8 depicts one embodiment of a container-type data center with a cooling unit, in accordance with one or more aspects of the present invention.

As noted, disclosed herein are various cooling units for extracting heat from a coolant circulating within a data center, such as container-type data center. One embodiment of such as cooling unit 810 is illustrated in FIG. 8. In this embodiment, cooling unit 810 is configured and sized to reside on top of a container-type data center 800. An ambient airflow 811 flows through cooling unit 810 from an air intake vent 812 to an air exhaust vent 813. A coolant loop 802 couples cooling unit 810 to container-type data center 800 and is, in one example, a coolant loop at the cooling unit (or facility) side of a coolant distribution unit 801, such as described above in connection with FIG. 4. Note that, in an alternate embodiment, cooling unit 810 could be configured and positioned to mount to a side or end of the container-type data center, or to reside separate from the container, for example, along a side thereof.

Figure 9A:
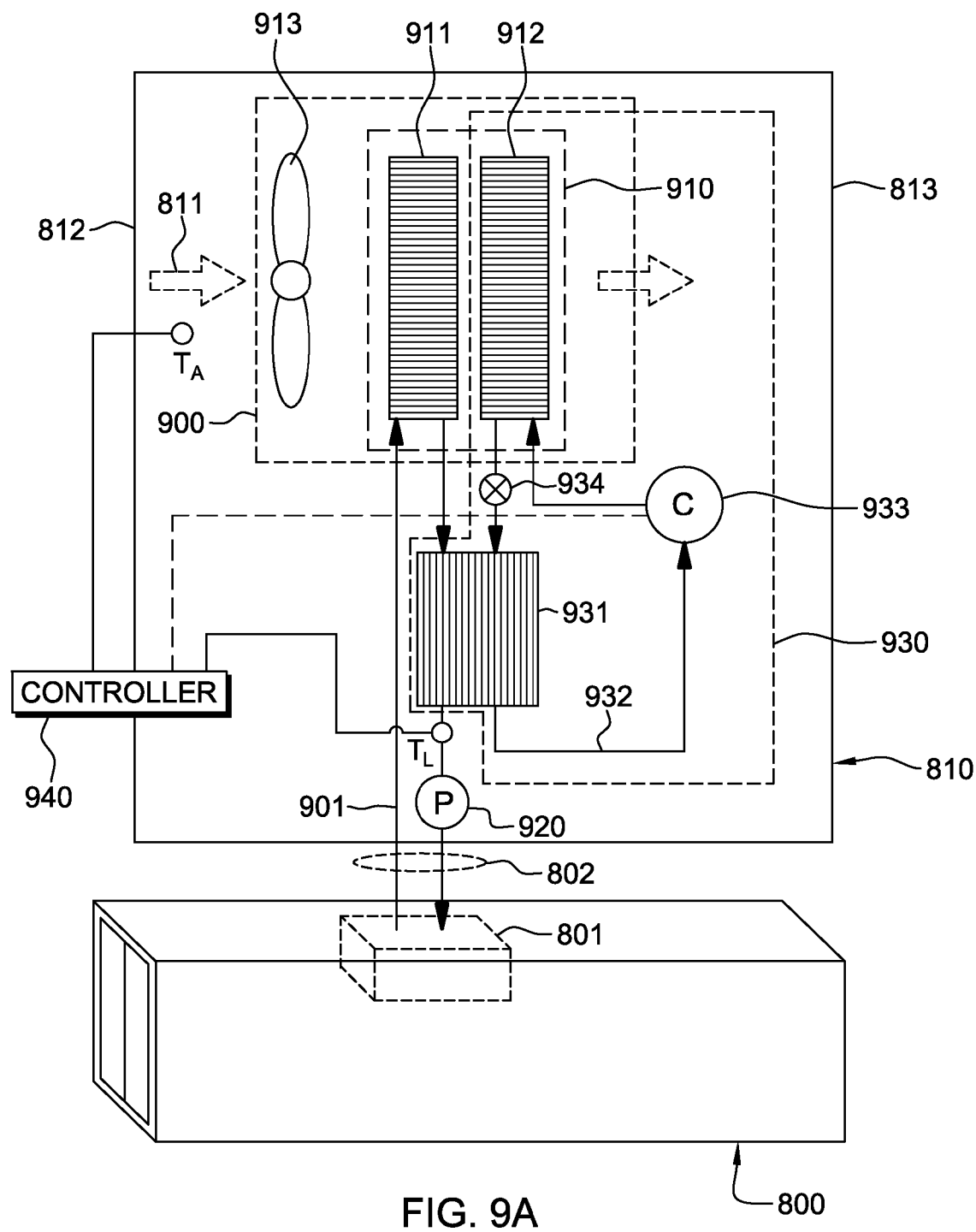
FIG. 9A is a schematic of one embodiment of the cooling unit of FIG. 8, in accordance with one or more aspects of the present invention.

FIG. 9A is a schematic of one embodiment of cooling unit 810 for the container-type data center 800 of FIG. 8. Cooling unit 810 includes air intake vent 812 and air exhaust vent 813 at opposite sides of the cooling unit for facilitating the ingress and egress of an ambient airflow 811 through the cooling unit. As illustrated, airflow 811 flows through a heat rejection unit 900 for rejecting heat from coolant passing through coolant loop 802 (and in particular, from coolant passing through a coolant inlet line 901 to cooling unit 810) to the airflow 811 passing across heat rejection unit 900.

In the embodiment illustrated, heat rejection unit 900 includes a heat exchange assembly 910, which is (for example) a dual heat exchanger structure comprising a first heat exchanger 911 and a second heat exchanger 912. In addition, heat rejection unit 900 includes one or more air-moving devices 913, which provide the airflow 811 through heat rejection unit 900 and across the first and second heat exchangers 911, 912. In the embodiment illustrated, the one or more air-moving devices 913, and the dual heat exchanger structure, comprising first heat exchanger 911 and second heat exchanger 912, are arranged such that the airflow 811 passes across first heat exchanger 911 before passing across second heat exchanger 912. As shown, first heat exchanger 911 of the dual heat exchanger structure couples in fluid communication with coolant loop 802 via, in this example, coolant inlet line 901, and returns cooled coolant to the container-type data center 800. In this embodiment, coolant return is facilitated via a pump 920, and the coolant passes through a liquid-to-liquid heat exchanger (alternately referred to as a coolant-to-refrigerant heat exchanger) 931 of a refrigeration unit 930 of the cooling unit 810. First air-to-liquid heat exchanger 911 is a passive coolant-to-air heat exchanger, and as shown in FIG. 9A, second heat exchanger 912 is coupled to refrigerant loop 932 of refrigeration unit 930, and operates as the condenser for the refrigeration unit 930.

In one embodiment, refrigeration unit 930 is a vapor-compression refrigeration unit, wherein the coolant-to-refrigerant heat exchanger 931 is a refrigerant evaporator, which is coupled to refrigeration loop 932 of the refrigeration unit. The refrigeration unit further comprises a compressor 933, and in addition to second heat exchanger 912, an expansion device 934, such as an expansion valve, capillary tube, or thermostatic valve. Thus, when the refrigeration unit is operational, expanded and cooled refrigerant is supplied to the refrigeration evaporator, i.e., the coolant-to-refrigeration heat exchanger 931. Subsequent to the refrigerant extracting heat from the coolant being returned to the data center (thereby further cooling the coolant), the refrigerant is returned via (in one embodiment) an accumulator (not shown), which operates to prevent liquid from entering compressor 933. Subsequent to the accumulator, vapor-phase refrigerant is returned to the compressor 933, where the cycle repeats.

In one specific implementation, the dual heat exchanger structure is a dual coil structure, wherein a first coil is part of the first air-to-liquid heat exchanger 911, and a second coil is part of the second air-to-liquid heat exchanger 912. Further, the dual heat exchanger structure may be an integrated (or monolithic) structure across which the ambient airflow stream is provided. In another specific implementation, the liquid-to-liquid heat exchanger 931 could be integrated into heat rejection unit 900, and in particular, into the heat exchanger assembly 910. For example, this can be accomplished by thermally or mechanically coupling the coolant return manifold of first heat exchanger 911 to the refrigerant return manifold of second heat exchanger 912, in which case, the second heat exchanger 912 would function as both the condenser and the evaporator for the refrigeration unit.

In the embodiment depicted in FIG. 9A, the cooling unit further comprises a controller 940, which is coupled to receive sensed temperatures from one or more temperature sensors $T_A$ and $T_L$, positioned and configured to sense one or more cooling-related, control temperatures to be employed by controller 940 as control temperatures used in controlling cooling unit 810, and in particularly, in controlling refrigeration unit 930. In the embodiment illustrated, temperature sensor $T_A$ is sensing temperature of ambient air flowing through heat rejection unit 900, and temperature sensor $T_L$ is sensing temperature of liquid coolant being returned, via pump 920, to the container-type data center.

In one embodiment, the cooling unit is a multi-mode cooling unit, and the controller operates the multi-mode cooling unit in one of a first mode or a second mode. In the first mode, the refrigeration unit 930 is OFF, and heat is rejected via the air-cooled, first heat exchanger 911 (alternatively referred to herein as a passive coolant-to-air heat exchanger) from coolant passing through coolant loop 802 to the airflow 811 passing across the dual heat exchanger structure. (The first heat exchanger 911 is passive in that it does not participate in the refrigeration loop.) In the second mode, the refrigeration unit 930 is ON, and heat is rejected via the first heat exchanger 911 and the second heat exchanger 912 to the airflow 811 passing across the first heat exchanger 911 and second heat exchanger 912. The controller is configured to automatically switch between the first mode and the second mode based on the one or more control temperatures sensed, for example, via temperature sensors $T_A$ and $T_L$. By way of example, the controller includes processing to switch between the first mode and the second mode depending upon the temperature $T_A$ of the ambient airflow 811 through heat rejection unit 900. In one implementation, if ambient temperature $T_A$ is greater than a defined threshold temperature $T_{TH}$, then the controller switches the refrigeration unit ON, and operates the cooling unit in the second mode. Conversely, if ambient temperature $T_A$ is less than the defined threshold temperature $T_{TH}$, then ambient air-cooling is able to passively bring coolant temperature down to a desired liquid coolant temperature $T_L$, and the refrigeration unit is OFF, with the cooling unit being operated in the first mode. Further, in one embodiment, the controller automatically, dynamically adjusts the auxiliary cooling provided by refrigeration unit 930 to the coolant being returned to the container-type data center 800. This automatic, dynamic adjustment can be achieved by monitoring temperature $T_A$ or $T_L$ and adjusting the speed of the compressor 933 of refrigeration unit 930 as need to achieve a desired coolant temperature. As a further enhancement, the controller could be configured to reference the IT load within the data center and/or a projection of a future increasing or decreasing IT load, to yield a decision whether to proactively turn ON or turn OFF the auxiliary (booster) refrigeration cooling.

Figure 9B:
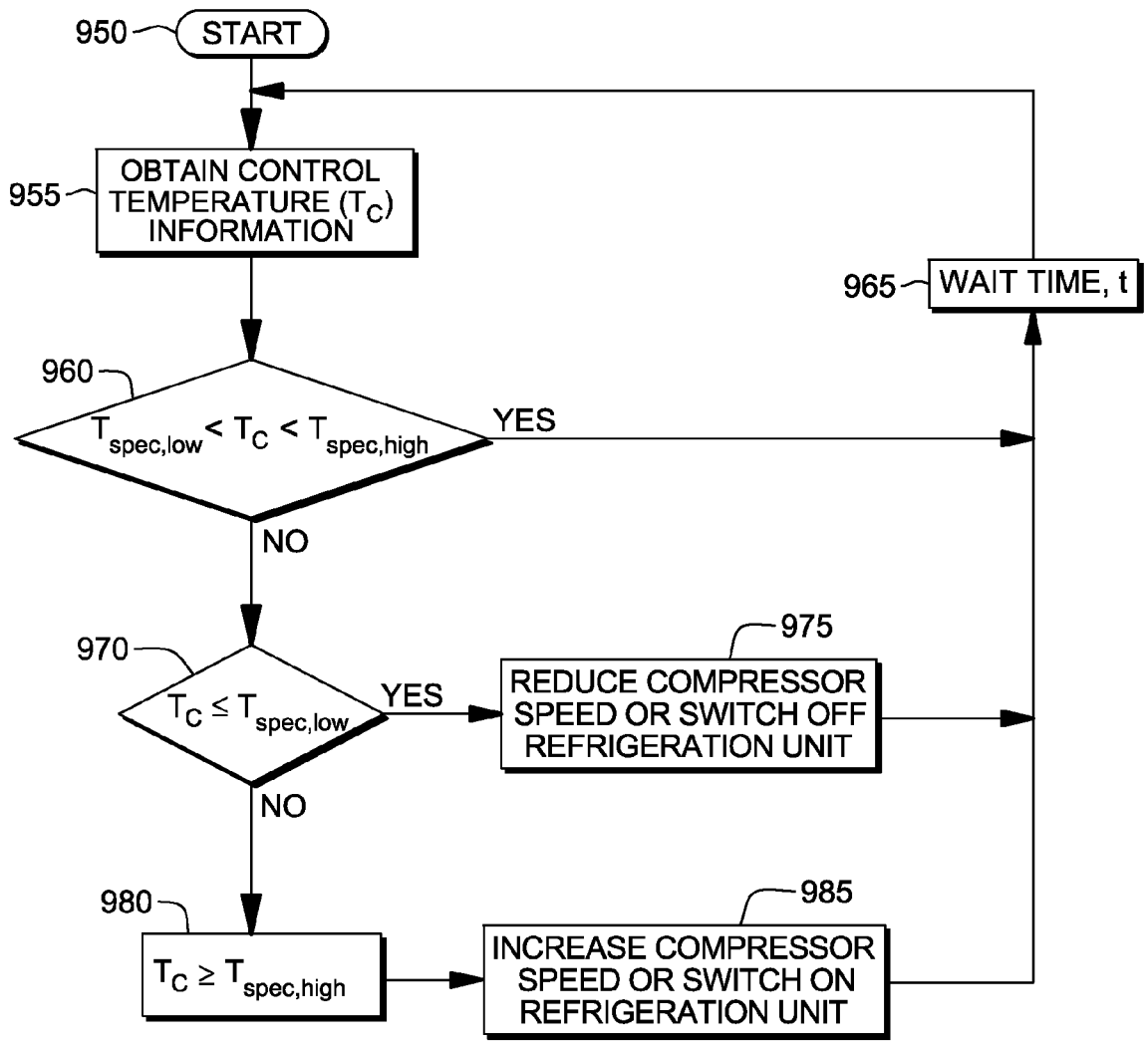
FIG. 9B depicts one embodiment of a process for automatically, dynamically adjusting mode of operation of the cooling unit, and the auxiliary cooling provided by the refrigeration unit (in one mode) of the cooling unit of FIG. 9A, in accordance with one or more aspects of the present invention.

FIG. 9B illustrates one embodiment of a process for controlling a multi-mode cooling unit such as described above. The control process begins 950 with the controller obtaining relevant control temperature $T_C$ information, for example, via temperature sensor $T_A$ or temperature sensor $T_L$ 955. Processing then determines whether the obtained control temperature $T_C$ is within a specified high and low temperature range ($T_{spec,high}$, $T_{spec,low}$) 960. If "yes", processing waits a time t 965 before repeating the process by obtaining then-current control temperature information 955. If one or more of the obtained control temperatures is out of specification, processing determines whether the obtained control temperature $T_C$ is less than or equal to the specified low temperature threshold ($T_{spec,low}$). If "yes", then processing reduces speed of the compressor, or depending on the temperature, switches the refrigeration unit OFF 975. Processing then waits time t 965 before repeating the process by obtaining the then-current control temperature information. If the obtained control temperature is outside of the specified temperature range, and is greater than the specified low temperature ($T_{spec,low}$), then the control temperature is necessarily greater than the specified high temperature ($T_{spec,high}$) 980, and processing either increases the compressor speed to increase the refrigerant cooling or switches the refrigeration unit ON 985 if the refrigeration unit was OFF, after which, processing waits time t before repeating the process.

Figure 10:
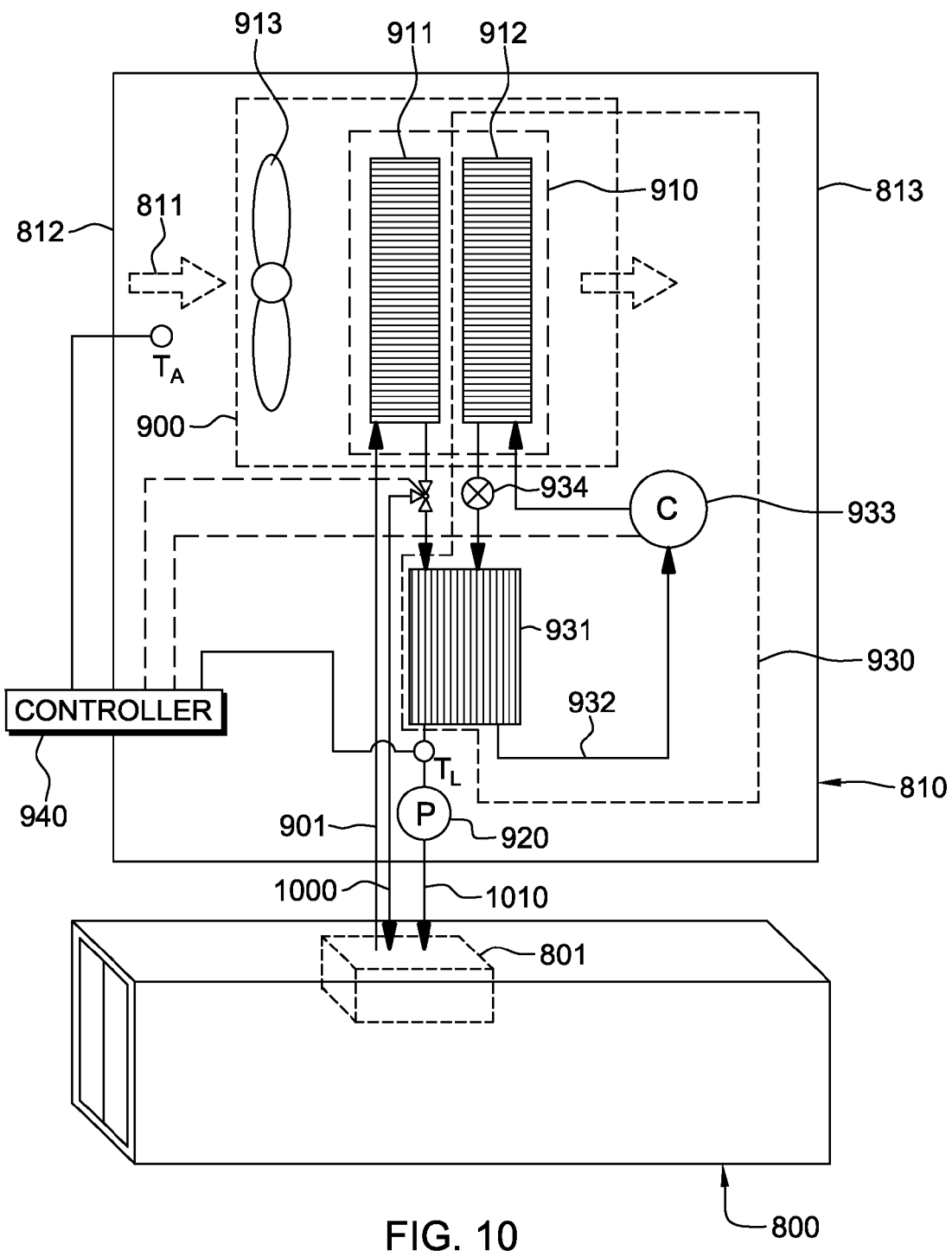
FIG. 10 depicts an alternate embodiment of a cooling unit for a container-type data center, in accordance with one or more aspects of the present invention.

FIG. 10 depicts an alternate embodiment of the cooling unit of FIGS. 9A & 9B. This cooling unit embodiment is substantially identical to that described above in connection with FIGS. 9A & 9B, except that first and second coolant outlet lines 1000, 1010, respectively, are provided from the cooling unit back to the container-type data center 800. In this embodiment, the cooling unit provides coolant at two different temperatures for return to the container-type data center. Coolant in the first coolant outlet line 1000 has passed through only the passive air-to-liquid heat exchanger 911, while coolant in the second coolant outlet line 1010 has undergone cooling via the passive first heat exchanger 911, as well as the auxiliary cooling of refrigeration unit 930 (i.e., in the second mode), and therefore, is at a lower temperature than the coolant being returned in first coolant outlet line 1000. Coolant flow into the first coolant outlet line 1000 and the second coolant outlet line 1010 is controlled by controller 940 by control of a controllable, three-way valve disposed in the coolant flow path between air-to-liquid heat exchanger 911 and the liquid-to-liquid heat exchanger 931 of the refrigeration unit 930.

Supply of two liquid coolant flows at different temperatures to the container might be advantageous in an embodiment where (for example) the first coolant outlet line 1000 provides coolant at a warmer temperature to cool one or more heat sinks, that is, liquid-cooled structures or liquid-cooled cold plates, within one or more electronics racks within the data center, essentially, providing free cooling to those components, and the second coolant outlet line 1010 provides coolant which facilitates cooling of the recirculating air within the container-type data center. That is, the second coolant outlet line could feed coolant to one or more air-to-liquid heat exchangers or air-conditioners within the data center, which facilitate air-cooling of the components within the data center. Thus, in this implementation, only the air-cooled heat load within the data center receives the auxiliary or booster refrigeration-cooling, with the heat load being conductively cooled (via one or more liquid-cooled structures coupled to electronic components) being freely cooled via the airflow passing through the dual heat exchanger structure.

Those skilled in the art will note from the above description that provided herein are various cooling units and methods of cooling a data center which are very energy efficient. For example, the cooling units disclosed provide liquid-cooling of the data center with a warm coolant, and use ambient air temperature and coolant temperature as control parameters for selectively providing auxiliary refrigerant-cooling of the coolant being returned to the data center. Advantageously, all heat is rejected to the same ambient airflow stream passing through the cooling unit.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

In one example, a computer program product includes, for instance, one or more computer readable storage media to store computer readable program code means or logic thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages.

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiment with various modifications as are suited to the particular use contemplated.

What is claimed is:

1. An apparatus comprising:
a multi-mode cooling unit coupled, via a coolant loop, to cool one or more electronics rack of a data center, the multi-mode cooling unit comprising:
a heat rejection unit for rejecting heat from coolant passing through the coolant loop to air passing through the heat rejection unit, the heat rejection unit comprising:
a heat exchange assembly, the heat exchange assembly comprising a first heat exchanger and a second heat exchanger,
at least one air-moving device for providing airflow across the first heat exchanger and the second heat exchanger of the heat exchange assembly;
a controller operating the multi-mode cooling unit in a first cooling mode, wherein the second heat exchanger is OFF and heat is rejected from the coolant via the airflow passing across the first heat exchanger, and a second cooling mode, wherein the second heat exchanger is ON and heat is rejected from the coolant via the airflow passing across the first heat exchanger and the second heat exchanger;
a first coolant outlet line from the multi-mode cooling unit and a second coolant outlet line from the multi-mode cooling unit, wherein in the first cooling mode coolant output from the multi-mode cooling unit passes through the first coolant outlet line, and in the second cooling mode a first portion of coolant output from the multi-mode cooling unit passes through the first coolant outlet line and a second portion of coolant output from the multi-mode cooling unit passes through the second coolant outlet line, the first and second coolant outlet lines being coupled in fluid communication with the coolant loop;
a controllable valve, the controller controlling the controllable valve to direct the coolant towards at least one of the first coolant output line or the second coolant output line dependent on whether the multi-mode cooling unit is in the first cooling mode or the second cooling mode;
a refrigeration unit associated with the second coolant outlet line and comprising a coolant-to-refrigerant heat exchanger, the refrigeration unit being OFF in the first cooling mode and ON in the second cooling mode, and being controllable in the second cooling mode to selectively extract heat from the second portion of coolant passing through the second coolant outlet line via the coolant-to-refrigerant heat exchanger so that in the second cooling mode the second portion of coolant passing through the second coolant outlet line is at a cooler temperature than the first portion of coolant passing through the first coolant outlet line of the multi-mode cooling unit; and
wherein the first heat exchanger of the heat exchange assembly is coupled in fluid communication with the coolant loop, and the second heat exchanger of the heat exchange assembly is coupled in fluid communication with a refrigeration loop of the refrigeration unit.

2. The apparatus of claim 1, wherein the at least one air-moving device, the first heat exchanger, and the second heat exchanger of the heat rejection unit, are configured and arranged so that the airflow passes across the first heat exchanger before passing across the second heat exchanger.

3. The apparatus of claim 1, further comprising one or more temperature sensors for sensing one or more control temperatures, and wherein the controller automatically switches between the first cooling mode and the second cooling mode based on the one or more control temperatures sensed by the one or more temperature sensors.

4. The apparatus of claim 3, wherein the one or more control temperatures comprise at least one of a temperature of the airflow across the first heat exchanger and the second heat exchanger, or a temperature of the coolant passing through the coolant loop.

5. The apparatus of claim 3, wherein in the second cooling mode, the controller automatically, dynamically adjusts the extracting of heat from the second portion of the coolant based on the one or more control temperatures sensed by the one or more temperatures sensors.

6. The apparatus of claim 5, wherein the controller automatically, dynamically adjusts the extracting of heat from the second portion of the coolant by automatically, dynamically adjusting a speed of a compressor of the refrigeration unit coupled in fluid communication with the refrigeration loop.

7. The apparatus of claim 1, wherein the coolant-to-refrigerant heat exchanger comprises a first flow path coupled in fluid communication with the second coolant outlet line of the coolant loop, and a second flow path coupled in fluid communication with the refrigerant loop, and the coolant-to-refrigeration heat exchanger facilitates selectively extracting heat from the second portion of the coolant, passing through the first flow path thereof, via the refrigerant passing through the second flow path thereof in the second mode of the multi-mode cooling unit.

8. The apparatus of claim 7, wherein the first heat exchanger is an air-cooled, coolant-to-air heat exchanger, and the second heat exchanger is a condenser of the refrigeration unit, the refrigeration unit being a vapor-compression refrigeration unit.

9. The apparatus of claim 1, wherein the data center is a container-type data center comprising a container, and wherein the cooling unit is configured to reside on top of the container of the container-type data center.

10. The apparatus of claim 1, wherein coolant flowing through the first coolant outlet line cools one or more liquid-cooled structures for conduction cooling one or more electronic components of the data center, and coolant flowing through the second coolant outlet line extracts heat from air circulating within the data center via one or more air-to-liquid heat exchangers of the data center.

11. A data center comprising:
a plurality of electronics racks;
a container housing the plurality of electronics racks;
a coolant loop facilitating extraction of heat generated within one or more of the electronics racks of the plurality of electronics racks housed within the container; and
a multi-mode cooling unit coupled to the coolant loop, the multi-mode cooling unit comprising:
a heat rejection unit coupled in fluid communication with the coolant loop for rejecting heat from coolant passing through the coolant loop to air passing across the heat rejection unit, the heat rejection unit comprising:
a heat exchange assembly, the heat exchange assembly comprising a first heat exchanger and a second heat exchanger;
at least one air-moving device for providing airflow across the first heat exchanger and the second heat exchanger of the heat exchange assembly;
a controller operating the multi-mode cooling unit in a first cooling mode, wherein the second heat exchanger is OFF and heat is rejected from the coolant via the airflow passing across the first heat exchanger, and a second cooling mode, wherein the second heat exchanger is ON and heat is rejected from the coolant via the airflow passing across the first heat exchanger and the second heat exchanger;
a first coolant outlet line from the multi-mode cooling unit and a second coolant outlet line from the multi-mode cooling unit, wherein in the first cooling mode coolant output from the multi-mode cooling unit passes through the first coolant outlet line, and in the second cooling mode a first portion of coolant output from the multi-mode cooling unit passes through the first coolant outlet line and a second portion of coolant output from the multi-mode cooling unit passes through the second coolant outlet line, the first and second coolant outlet lines being coupled in fluid communication with the coolant loop;
a controllable valve, the controller controlling the controllable valve to direct the coolant towards at least one of the first coolant output line or the second coolant output line dependent on whether the multi-mode cooling unit is in the first cooling mode or the second cooling mode;
a refrigeration unit associated with the second coolant outlet line and comprising a coolant-to-refrigerant heat exchanger, the refrigeration unit being OFF in the first cooling mode and ON in the second cooling mode, and being controllable in the second cooling mode to selectively extract heat from the second portion of coolant passing through the second coolant outlet line via the coolant-to-refrigerant heat exchanger so that in the second cooling mode the second portion of coolant passing through the second coolant outlet line is at a cooler temperature than the first portion of coolant passing through the first coolant outlet line of the multi-mode cooling unit; and
wherein the first heat exchanger of the heat exchange assembly is coupled in fluid communication with the coolant loop, and the second heat exchanger of the heat exchange assembly is coupled in fluid communication with a refrigeration loop of the refrigeration unit.

12. The data center of claim 11, wherein the at least one air-moving device, the first heat exchanger, and the second heat exchanger of the heat rejection unit, are configured and arranged so that the airflow passes across the first heat exchanger before passing across the second heat exchanger, and wherein the first heat exchanger and the second heat exchanger are an integrated structure.

13. The data center of claim 11, wherein the multi-mode cooling unit further comprises one or more temperature sensors for sensing one or more control temperatures, and wherein the controller automatically switches between the first cooling mode and the second cooling mode based on the one or more control temperatures sensed by the one or more temperature sensors, and wherein the controller further automatically, dynamically adjusts extracting of heat from the second portion of the coolant in the second cooling mode based on the one or more control temperatures sensed by the one or more temperature sensors.

14. The data center of claim 11, wherein the refrigeration unit further comprises a coolant-to-refrigerant heat exchanger, the coolant-to-refrigerant heat exchanger comprising a first flow path coupled in fluid communication with the second coolant outlet line of the coolant loop, and a second flow path coupled in fluid communication with the refrigerant loop, and the coolant-to-refrigeration heat exchanger facilitating extracting of heat from the second portion of the coolant, passing through the first flow path thereof, via the refrigerant passing through the second flow path thereof in the second mode of the multi-mode cooling unit.

15. The data center of claim 14, wherein the first heat exchanger is an air-cooled, coolant-to-air heat exchanger, and the second heat exchanger is a condenser of the refrigeration unit, the refrigeration unit being a vapor-compression refrigeration unit.

16. The data center of claim 11, wherein the multi-mode cooling unit is sized and configured to reside on top of the container of the data center.

17. A method of fabricating a cooling unit for a data center, the method comprising:
providing a multi-mode cooling unit coupled, via a coolant loop, to cool one or more electronics racks of the data center, the multi-mode cooling unit comprising:
a heat rejection unit for rejecting heat from coolant passing through the coolant loop to air passing across the heat rejection unit, the heat rejection unit comprising:
a heat exchange assembly, the heat exchange assembly comprising a first heat exchanger and a second heat exchanger;
at least one air-moving device for providing airflow across the first heat exchanger and the second heat exchanger of the heat exchange assembly;
a controller operating the multi-mode cooling unit in a first cooling mode, wherein the second heat exchanger is OFF and heat is rejected from the coolant via the airflow passing across the first heat exchanger, and a second cooling mode, wherein the second heat exchanger is ON and heat is rejected from the coolant via the airflow passing across the first heat exchanger and the second heat exchanger;
a first coolant outlet line from the multi-mode cooling unit and a second coolant outlet line from the multi-mode cooling unit, wherein in the first cooling mode coolant output from the multi-mode cooling unit passes through the first coolant outlet line, and in the second cooling mode a first portion of coolant output from the multi-mode cooling unit passes through the first coolant outlet line and a second portion of coolant output from the multi-mode cooling unit passes through the second coolant outlet line, the first and second coolant outlet lines being coupled in fluid communication with the coolant loop;
a controllable valve, the controller controlling the controllable valve to direct the coolant towards at least one of the first coolant output line or the second coolant output line dependent on whether the multi-mode cooling unit is in the first cooling mode or the second cooling mode;
a refrigeration unit associated with the second coolant outlet line and comprising a coolant-to-refrigerant heat exchanger, the refrigeration unit being OFF in the first cooling mode and ON in the second cooling mode, and being controllable in the second cooling mode to selectively extract heat from the second portion of coolant passing through the second coolant outlet line via the coolant-to-refrigerant heat exchanger so that in the second cooling mode the second portion of coolant passing through the second coolant outlet line is at a cooler temperature than the first portion of coolant passing through the first coolant outlet line of the multi-mode cooling unit; and
wherein the first heat exchanger of the heat exchange assembly is coupled in fluid communication with the coolant loop, and the second heat exchanger of the heat exchange assembly is coupled in fluid communication with a refrigeration loop of the refrigeration unit.

18. The method of claim 17, wherein providing the multi-mode cooling unit further comprises providing the at least one air-moving device, the first heat exchanger and the second heat exchanger of the heat rejection unit in a configuration where the airflow passes across the first heat exchanger before passing across the second heat exchanger, and wherein the method further comprises providing one or more temperature sensors for sensing one or more control temperatures, the controller automatically switching between the first cooling mode and the second cooling mode based on the one or more control temperatures sensed by the one or more temperature sensors, and the controller further automatically, dynamically adjusting selectively extracting heat from the second portion of the coolant in the second cooling mode based on the one or more control temperatures sensed by the one or more temperature sensors.

* * * * *